United States Patent
Hu

(10) Patent No.: US 8,058,564 B2
(45) Date of Patent: Nov. 15, 2011

(54) CIRCUIT BOARD SURFACE STRUCTURE

(75) Inventor: Wen-Hung Hu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 544 days.

(21) Appl. No.: 12/043,689

(22) Filed: Mar. 6, 2008

(65) Prior Publication Data

US 2008/0217047 A1 Sep. 11, 2008

(30) Foreign Application Priority Data

Mar. 7, 2007 (TW) .............................. 96107788 A

(51) Int. Cl.
*H05K 1/09* (2006.01)
(52) U.S. Cl. ........................................ 174/257; 174/261
(58) Field of Classification Search .................. 174/257, 174/250, 262; 438/167, 613, 574; 257/778
See application file for complete search history.

(56) References Cited

U.S. PATENT DOCUMENTS

| | | | | |
|---|---|---|---|---|
| 5,858,824 | A * | 1/1999 | Saitoh | 438/167 |
| 2006/0252248 | A1* | 11/2006 | Hu | 438/613 |
| 2006/0278997 | A1* | 12/2006 | Gibson et al. | 257/778 |
| 2006/0279881 | A1* | 12/2006 | Sato | 360/324.12 |
| 2010/0085997 | A1* | 4/2010 | Nishikawa et al. | 372/46.01 |

\* cited by examiner

*Primary Examiner* — Yuriy Semenenko
(74) *Attorney, Agent, or Firm* — Schmeiser Olsen & Watts LLP

(57) ABSTRACT

A circuit board surface structure includes a circuit board having at least one surface provided with a plurality of electrically connecting pads, an insulating protective layer characterized by photosensitivity and solder resisting and formed on the circuit board, and a plurality of openings formed in the insulating protective layer to expose the electrical connecting pads on the circuit board and tapered upward; and a conductive element formed in the opening, so as to increase the contact area and reinforce bonding between the electrically connecting pads and the conductive element.

11 Claims, 5 Drawing Sheets

CIRCUIT BOARD SURFACE STRUCTURE

BACKGROUND OF THE INVENTION

1. Field of the Invention

The present invention relates to circuit board surface structures, and more particularly, to a circuit board surface structure comprising a circuit board with electrically connecting pads having conductive elements formed thereon for external electrical connection.

2. Description of the Prior Art

According to flip chip technology nowadays, a semiconductor chip is electrically connected to a circuit board, in which electrode pads are provided on the active surface of the integrated circuit-equipped (IC-equipped) semiconductor chip, and the circuit board is provided with electrically connecting pads corresponding to the electrode pads. A solder structure or other conductive adhesive material is formed between the electrode pad of the semiconductor chip and the electrically connecting pad of the circuit board for providing electrical connection and mechanical coupling between the semiconductor chip and the circuit board.

As shown in FIG. 1, in the flip chip technology, a plurality of metallic bumps 11 are formed on the electrode pads 12 of a semiconductor chip and a plurality of pre-solder structures 14 made of solder materials are formed on the electrically connecting pads 15 of a circuit board 16, then after a reflow soldering process, the pre-solder structures 14 are reflow soldered to the corresponding metallic bumps 11, so as to form a plurality of solder points 17. Subsequently, an underfill material 18 is provided between the semiconductor chip 13 and circuit board 16, coupling the semiconductor chip 13 with the circuit board 16, so as to ensure a satisfactory electrical connection.

Referring to FIGS. 2A-2D, cross-sectional views illustrating the steps of depositing a solder material on electrically connecting pads of a circuit board are shown. As shown in FIG. 2A, a circuit board 20 having electrically connecting pads 201 on a surface thereof is provided, whereon a solder resisting layer such as solder mask layer 21 is applied on the surface of the circuit board 20. A photomask 22 is formed above the electrically connecting pads 201, and through a series of exposure and development processes, openings are formed to expose the electrically connecting pads 201. In the exposure process, light rays which might otherwise travel straight on bend beneath the opaque region 22a of the photomask 22 due to diffraction, as indicated by the direction S, such that part of the solder mask layer 21 under the photomask 22 is illuminated. Next, as shown in FIG. 2B, after the development process, the opening 210 is tapered downward. Subsequently, as shown in FIG. 2C, a stencil board 23 having a plurality of grids 23a is disposed on the circuit board 20, in which each grid 23a of the stencil board 23 is corresponding to each electrically connecting pad. A solder material is applied on the surface of the stencil board 23, followed by using a roller 24 to roll back and forth on the stencil board 23, or spraying the solder material (not shown) in each grid 23a of the stencil board 23 on each electrically connecting pad 201 after removal of the stencil board 23. As shown in FIG. 2D, then a reflow soldering process is performed to reflow solder the solder material to form solder bumps 25 on the electrically connecting pads 201 of the circuit board 20, such that solder structures can be successfully formed on the circuit board using a stencil printing technology.

However, in the demand of miniaturization and increased functionality of electronic products, the circuit layout is designed to be higher in density and the distance between each circuit layer is also shortened. Thus, a circuit board with high density of circuit layout must have a reduced circuit width and smaller electrically connecting pads. As a gap between the circuits is reduced, the opening on the solder mask layer above the electrically connecting pads must be miniaturized further, and this may reduce the contact area between the solder structure and electrically connecting pad, such that it is more difficult to form a solder material on the electrically connecting pad, thereby failing to satisfy the requirement for fine pitch of the electrically connecting pads in advanced electronic products.

Moreover, as the opening 210 of the solder mask layer 21 is have a tapered downward shape, the bottom portion of the solder bump 25 is smaller than the top portion thereof, causing a decrease in the contact area between the solder bump 25 and the electrically connecting pad 201, thereby reducing the bonding between the solder bump 25 and the electrically connecting pad 201. In addition, the solder bump 25 in the opening 210 of the solder mask layer 21 is also tapered downward, but is not provided with any other coupling means, and thus the solder bump 25 is likely to detach from the electrically connecting pad 201.

Accordingly, there is an urgent need for developing an electrical connection structure for circuit boards with a view to overcoming drawbacks of the prior art, namely difficulty in forming a solder structure on surfaces of electrically connecting pads, difficulty in meeting the requirements for a fine pitch between electrically connecting pads of advanced electronic products, and detachment of conductive elements.

SUMMARY OF THE INVENTION

In light of the foregoing drawbacks of the prior art, a primary objective of the present invention is to provide a circuit board surface structure with enhanced bonding strength between the conductive elements and the circuit board.

Another objective of the invention is to provide a circuit board surface structure such that the electrically connecting pads have a larger contact area for increasing the contact area between the conductive elements and the electrically connecting pads.

In order to achieve the foregoing and other objectives, the circuit board surface structure comprises: a circuit board having a plurality of electrically connecting pads on at least one surface thereof; an insulating protective layer characterized by photosensitivity and a solder resisting function and formed on the surface of the circuit board; and openings formed in the insulating protective layer for exposing the electrically connecting pads on the circuit surface and tapered upward, wherein each of the openings has a top part and a bottom part, and a projected area of the top part is smaller than a projected area of the bottom part.

According to the foregoing structure, the present invention further comprises a conductive element electroplated to the opening of the insulating protective layer for electrically connecting with the electrically connecting pad. The conductive element is made of a solder, such as Sn, Sn—Ag, Sn—Ag—Cu, Sn—Pb, and Sn—Cu. A conductive layer is formed between the conductive element and the electrically connecting pad. The conductive layer is made of a material selected from the following: Cu, Sn, Ni, Cr, Ti, Cu—Cr, and Sn—Pb. The conductive layer can be made of a conductive polymer.

The insulating protective material is made of a photosensitive dielectric material. The photosensitive dielectric material is, selectively, a solder mask, a liquid photosensitive dielectric material, or a dry film photosensitive dielectric material. The liquid photosensitive dielectric material is formed on the surface of the circuit board by a non-printing means, such as roller coating, spray coating, dipping coating, and spin coating. The dry film photosensitive dielectric material is laminated onto the surface of the circuit board.

In summary, the circuit board surface structure of the present invention, mainly involves forming a solder mask layer on the circuit board having electrically connecting pads, then through exposure and development process with quantitative control of heat and light, openings tapered upward are formed in the insulating protective layer, allowing the electrically connecting pads to have a larger exposed contact area, so as to increase the contact area between the conductive elements and the electrically connecting pads, and reinforce bonding between the conductive elements in the openings of the insulating protective layer and the electrically connecting pads. Moreover, the present invention provides sufficient bonding strength for the conductive elements formed on the fine pitch electrically connecting pads, thereby eliminating a drawback of the prior art, that is, difficulty in attaching a solder material to the surface of electrically connecting pads.

BRIEF DESCRIPTION OF THE DRAWINGS

The present invention can be more fully understood by reading the following detailed description of the preferred embodiment, with reference made to the accompanying drawings, wherein.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

FIGS. 3A-3I are cross-sectional views showing how to fabricate a circuit board surface structure of the present invention.

Figure 1:
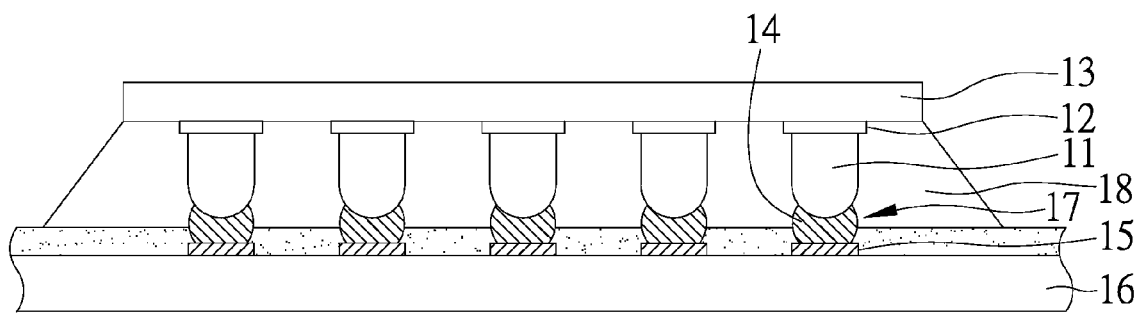
FIG. 1 (PRIOR ART) is a cross-sectional view of a conventional flip chip structure.
Figure 2A:
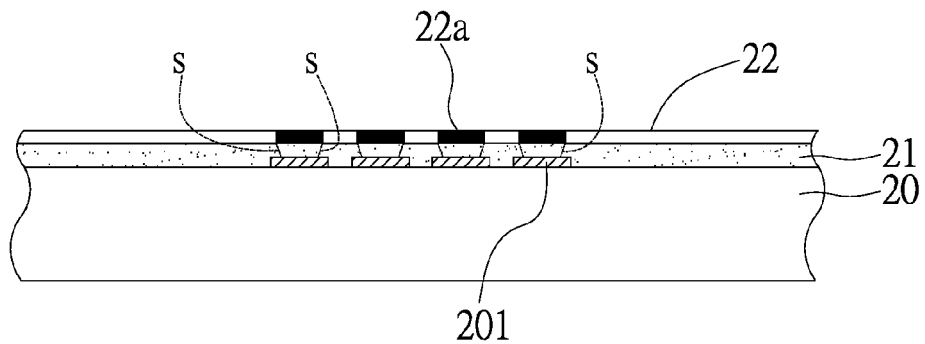
FIGS. 2A-2D (PRIOR ART) are cross-sectional views showing how to fabricate a conventional circuit board with conductive elements formed thereon in advance.
Figure 2B:
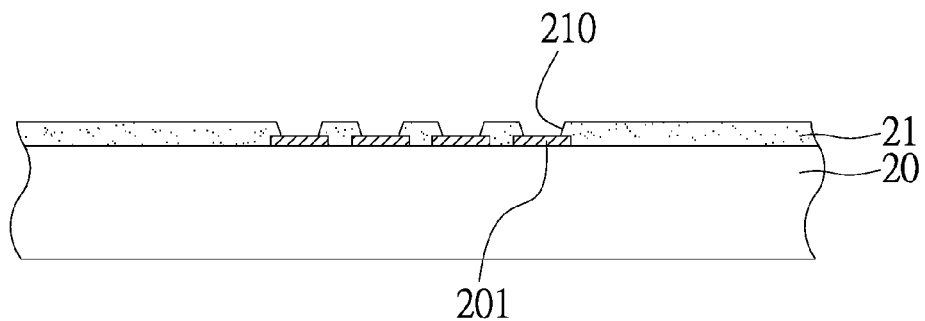
Figure 2C:
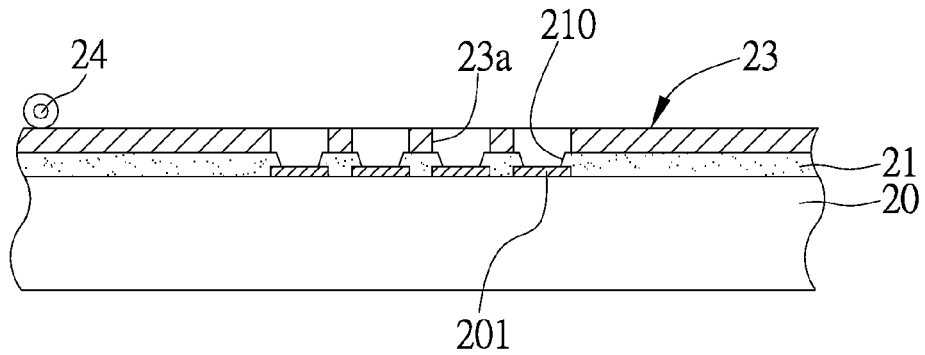
Figure 2D:
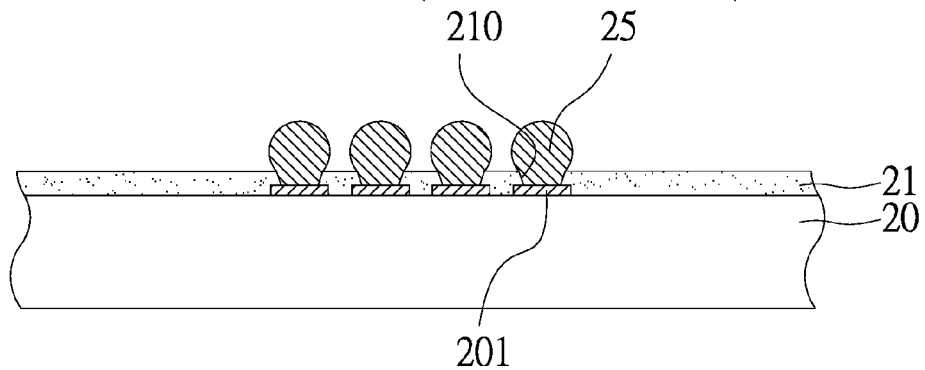
Figure 3A:
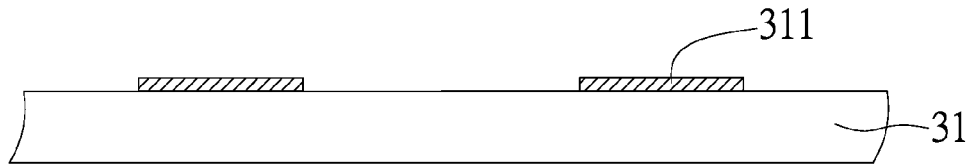
FIGS. 3A-3I are cross-sectional views showing how to fabricate a circuit board surface structure of the present invention.

Referring to FIG. 3A, a circuit board 31 resulted from a front end patterning process is provided. A plurality of electrically connecting pads 311, and optionally a plurality of conductive circuits (not shown), are formed on at least one surface of the circuit board 31. There are numerous complicated processes of forming conductive circuits and electrically connecting pads on a circuit board. The processes are widely known by those skilled in the art, but are irrelevant to essential technical features of the present invention. Therefore, the processes are not described herein.

Figure 3B:
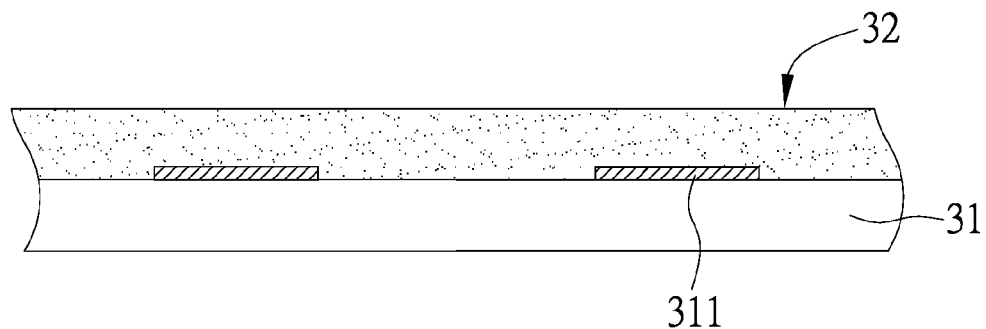

Referring to FIG. 3B, an insulating protective layer 32 is formed on the surface of the circuit board 31 having the electrically connecting pads 311. The insulating protective layer 32 is cured by a heating process such as dry baking. The insulating protective layer 32 is made of a photosensitive dielectric material. The photosensitive dielectric material is, selectively, a solder mask, a liquid photosensitive dielectric material, or a dry film photosensitive dielectric material. The liquid photosensitive dielectric material is formed on the surface of the circuit board 31 by a non-printing means, such as roller coating, spray coating, dipping coating, and spin coating. The dry film photosensitive dielectric material is formed on the surface of the circuit board 31 by lamination.

Figure 3C:
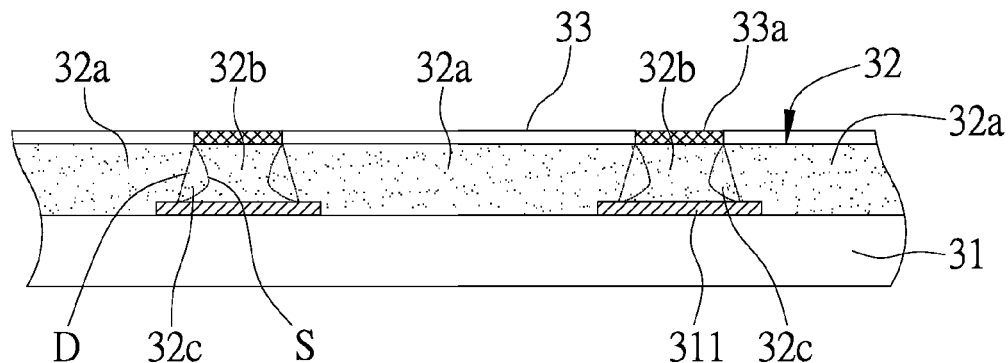

Referring to FIG. 3C, a photomask 33 having an opaque region 33a is disposed on the surface of the insulating protective layer 32. The opaque region 33a of the photomask 33 corresponds in position to the electrically connecting pads 311 of the circuit board 31. Afterward, an exposure process begins, wherein light rays which might otherwise travel straight on bend beneath the opaque region 33a due to diffraction, resulting in a diffraction effect line S, such that part of the insulating protective layer 32 beneath the opaque region 33a is illuminated. At the process when light penetrates the insulating protective layer 32, light energy is absorbed by the insulating protective layer 32, thereby resulting in a cross linking reaction. The cross linking reaction takes place more markedly at the surface of the insulating protective layer 32 than the bottom of the insulating protective layer 32; in other words, the effect of diffraction decreases with the distance traveled by the penetrating light rays in the insulating protective layer 32, as indicated by a distance effect line D. Monomers in a portion of the insulating protective layer 32 not covered by the photomask 33 undergo a light energy-dependent reaction to form a complete cross-linked polymer, so as to form a hardened region 32a by curing. A portion of the insulating protective layer 32 covered by the photomask 33 is referred to as a non-hardened region 32b free of any light energy-dependent reaction. A portion of the insulating protective layer 32 between the diffraction effect line S and the distance effect line D is referred to as a half-hardened region 32c characterized by half cross linking in an incomplete light energy-dependent reaction. It should be noted that a process parameter can be modified, for example, properly reducing the energy level of light irradiation, to alter the curve of the diffraction effect line S, such that diffraction has a greater impact on the surface of the insulating protective layer 32 than the bottom of the insulating protective layer 32.

Figure 3D:
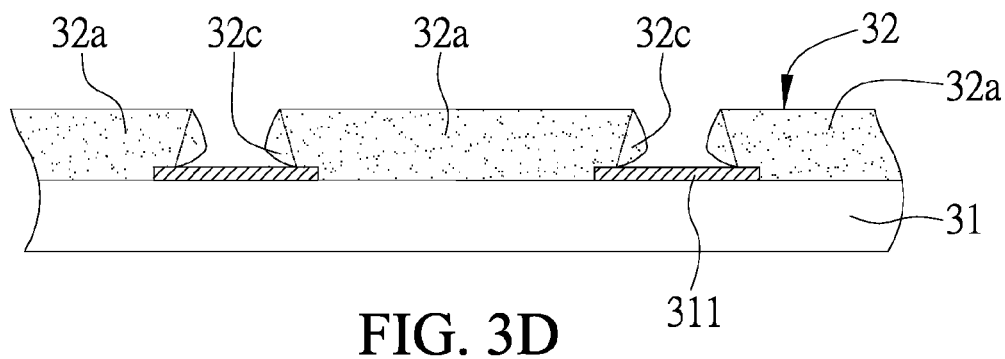

Referring to FIG. 3D, the photomask 33 is removed to expose the surface of the insulating protective layer 32, and then the non-hardened region 32b is dissolvedly removed by a development process.

Figure 3E:
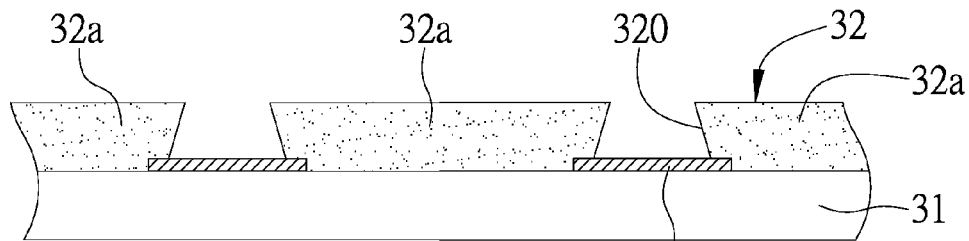

Referring to FIG. 3E, the dissolving time is lengthened to further dissolvedly remove the half-hardened region 32c, so as to form an upwardly-tapered opening 320. wherein each of the openings 320 has a top part and a bottom part, and a projected area of the top part is smaller than a projected area of the bottom part. Afterward, a portion of the half-hardened region 32c which has not been completely dissolvedly removed is completely cured by means of light energy and heat energy, so as to finalize the shaping of the opening 320.

Figure 3F:
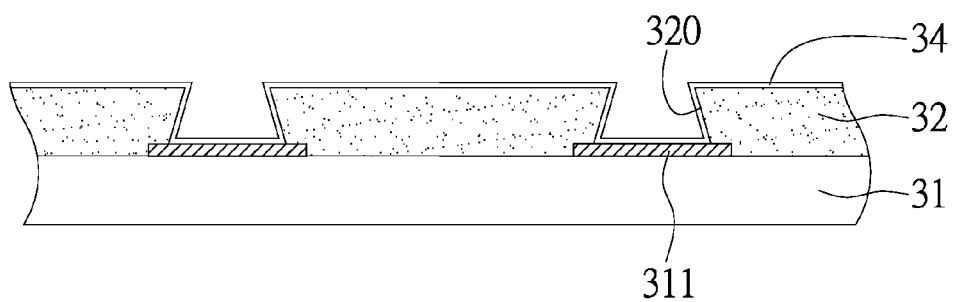

Referring to FIG. 3F, a conductive layer 34 is formed on the surface of the insulating protective layer 32 and in the opening 320. The conductive layer 34 which functions as an electrical current conductive path required for a metal undergoing a subsequent electroplating process is implemented as a metal, an alloy, or a plurality of deposited metal layers, comprising Cu, Sn, Ni, Cr, Ti, Cu—Cr alloy, or Sn—Pb alloy. Alternatively, the conductive layer 34 can be made of a conductive polymer, such as polyacetylene, polyaniline, and organic sulfur polymer.

Figure 3G:
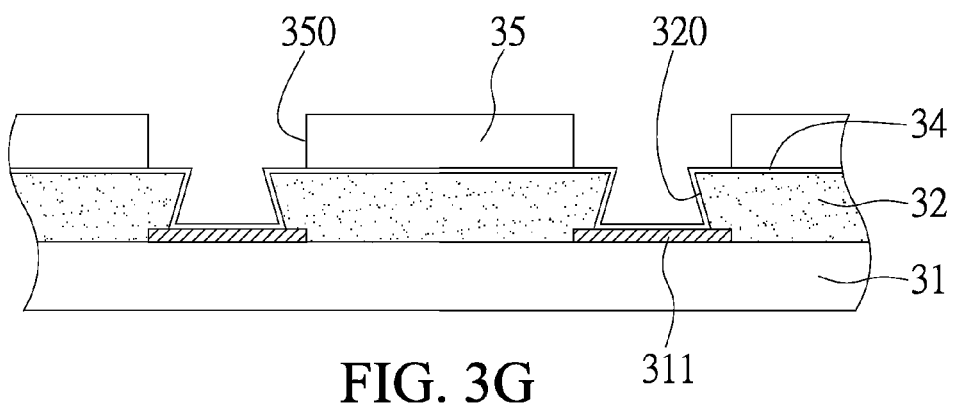

Referring to FIG. 3G, a resist layer 35 is formed on the surface of the conductive layer 34, and openings 350 are formed in the resist layer 35 to expose the conductive layer 34 on the surface of the electrically connecting pads 311. The resist layer 35 can be a dry film or liquid photoresist layer formed on the surface of the conductive layer 34 by printing, spin coating, or adhesion; afterward, the resist layer 35 is patterned by exposure and development to form the openings 350.

Figure 3H:
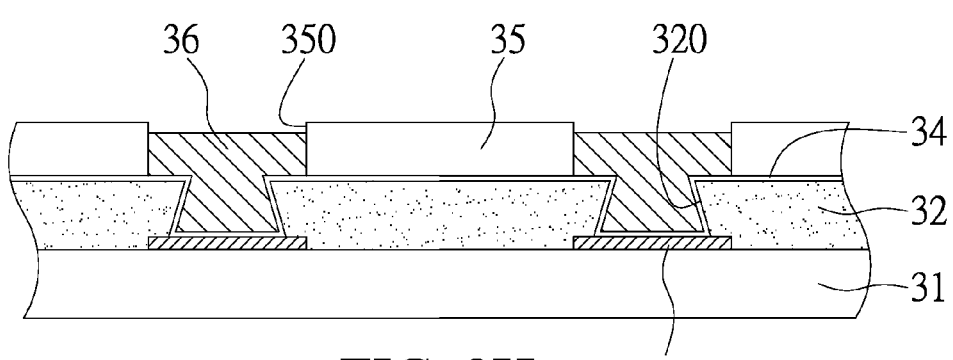

Referring to FIG. 3H, an electroplating process is performed on the circuit board 31. Since the conductive layer 34 has high conductivity, it is used as an electrical conduction path during an electroplating process to form a conductive element 36 on the electrically connecting pad 311 in the opening 350 of the resist layer 35 and the opening 320 of the insulating protective layer 32. The opening 320 which is tapered upward enables a relatively large contact area between the conductive element 36 and the electrically connecting pad 311, thereby increasing shear stress. Moreover the conductive element 36 can be perfectly fit in the insulating protective layer 32 through the tapered opening 320; as a result, the bonding strength is enhanced, and detachment of the conductive element 36 is prevented. The conductive element 36 is, selectively, an alloy of any combinations of Pb, Sn, Ag, Au, Bi, Sb, Zn, Ni, Zr, Mg, In, Te and Ga.

Figure 3I:
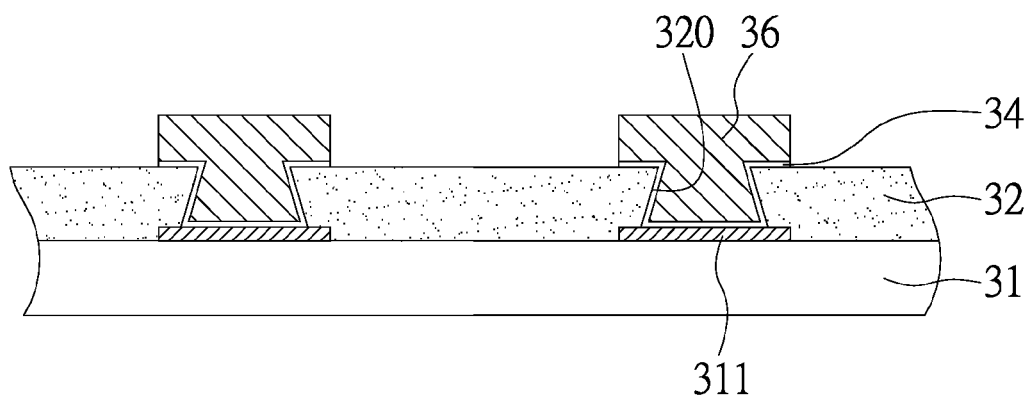

Referring to FIG. 3I, lastly, the resist layer 35 and the overlaying conductive layer 34 are removed by mold release and etching. Since the process of removing the resist layer 35 and the conductive layer 34 are well known, the process is not described herein.

Where the conductive element 36 is a solder, a solder bump (not shown) is formed on the conductive element 36 by a reflow process for further electrical connection.

The circuit board surface structure of the present invention comprises a circuit board 31 having at least one surface provided with a plurality of electrically connecting pads 311, an insulating protective layer 32 formed on the surface of the circuit board 31 with upwardly-tapered openings 320 formed, by dry baking, exposure, and development, in the insulating protective layer 32 to expose the electrically connecting pads 311.

The insulating protective layer 32 is made of a photosensitive dielectric material. The photosensitive dielectric material is, selectively, a solder mask, a liquid photosensitive dielectric material, or a dry film photosensitive dielectric material. The liquid photosensitive dielectric material is formed on the surface of the circuit board 31 by a non-printing means, such as roller coating, spray coating, dipping coating, and spin coating. The dry film photosensitive dielectric material is laminated onto the surface of the circuit board 31.

The foregoing structure further comprises a conductive element 36 formed in the opening 320 of the insulating protective layer 32 and electrically connected to the electrically connecting pad 311. The conductive element 36 is a solder, which is made of a material selected from any of the following: Sn, Sn—Ag, Sn—Ag—Cu, Sn—Pb, and Sn—Cu.

The foregoing structure further comprises a conductive layer 34 formed between the conductive element 36 and the electrically connecting pad 311. The conductive layer 34 is made of a material selected from the following: Cu, Sn, Ni, Cr, Ti, Cu—Cr, and Sn—Pb. The conductive layer can be made of a conductive polymer.

The circuit board surface structure of the present invention, mainly involves forming a solder mask layer on the circuit board having electrically connecting pads, then through exposure and development processes with quantitative control of heat and light, upwardly-tapered openings are formed in the insulating protective layer, allowing the electrically connecting pads 31 to have a relatively large exposed contact area, so as to increase the contact area between the conductive elements and the electrically connecting pads, and reinforce bonding between the conductive elements in the openings of the insulating protective layer and the electrically connecting pads. The present invention provides sufficient bonding strength for the conductive elements formed on the fine pitch electrically connecting pads, thereby overcoming a drawback of the prior art, that is, difficulty in attaching a solder material to the surface of an electrically connecting pad.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit board surface structure, comprising:
   a circuit board having at least one surface provided with a plurality of electrically connecting pads;
   an insulating protective layer characterized by photosensitivity and solder resisting and formed on a surface of the circuit board;
   openings formed in the insulating protective layer to expose the electrically connecting pads on the circuit board, the openings being tapered upward, wherein each of the openings has a top part and a bottom part, and a projected area of the top part is smaller than a projected area of the bottom part; and
   a conductive element formed in the opening of the insulating protective layer by electroplating for electrically connecting with the electrically connecting pad, wherein the opening tapered upward enables a relatively large contact area between the conductive element, the electrically connecting pad and the opening, and a portion of the conductive element is gripped by the insulating protective layer through the opening, thereby increasing capacity for shear stress, enhancing bonding strength and avoiding detachment of the conductive element.

2. The circuit board surface structure of claim 1, wherein the conductive element is a solder.

3. The circuit board surface structure of claim 2, wherein the solder is one selected from the group consisting of Sn, Sn—Ag, Sn—Ag—Cu, Sn—Pb, and Sn—Cu.

4. The circuit board surface structure of claim 1, further comprising a conductive layer formed between the conductive element and the electrically connecting pad.

5. The circuit board surface structure of claim 4, wherein the conductive layer is made of a material selected from the group consisting of Cu, Sn, Ni, Cr, Ti, Cu—Cr alloy, and Sn—Pb alloy.

6. The circuit board surface structure of claim 4, wherein the conductive layer is made of a conductive polymer.

7. The circuit board surface structure of claim 1, wherein the insulating protective layer is made of a photosensitive dielectric material.

8. The circuit board surface structure of claim 7, wherein the photosensitive dielectric material is a solder mask.

9. The circuit board surface structure of claim 7, wherein the photosensitive dielectric material is one of a liquid and a dry film.

10. The circuit board surface structure of claim 9, wherein the liquid photosensitive dielectric material is formed on the surface of the circuit board by a non-printing means selected from the group consisting of roller coating, spray coating, dipping coating, and spin coating.

11. The circuit board surface structure of claim 9, wherein the dry film photosensitive dielectric material is formed on the surface of the circuit board by lamination.

* * * * *